US006827779B1

(12) United States Patent
Marian

(10) Patent No.: US 6,827,779 B1
(45) Date of Patent: Dec. 7, 2004

(54) SELECTIVE MASS TRANSFER HOIST

(75) Inventor: Liviu Marian, Danbury, CT (US)

(73) Assignee: Interlab Inc., Danbury, CT (US)

( * ) Notice: Subject to any disclaimer, the term of this patent is extended or adjusted under 35 U.S.C. 154(b) by 0 days.

(21) Appl. No.: 10/607,089

(22) Filed: Jun. 26, 2003

(51) Int. Cl.[7] .................................................. B05C 3/00

(52) U.S. Cl. ...................... 118/423; 118/697; 118/699; 118/702

(58) Field of Search ......................... 118/423, 696–704, 118/503, 73; 134/76, 77, 82; 212/71; 198/346.3, 341.08, 341.09; 414/450, 222.05; 901/41, 43

(56) References Cited

U.S. PATENT DOCUMENTS 2,536,720 A * 1/1951 Brightly, Jr.
3,335,839 A * 8/1967 Neumann
4,575,299 A * 3/1986 Layton et al.

* cited by examiner

Primary Examiner—Brenda A. Lamb
(74) Attorney, Agent, or Firm—Steven R. Bartholomew

(57) ABSTRACT

A mass transfer system offers the simultaneous transfer and time-saving efficiencies transfer techniques, while also offering the flexibility of prior-art free techniques. A mass transfer mechanism and an associated software control mechanism are equipped with the ability to retract a plurality of lifting arms (6), in a manner so select which of the processing stages (2) the lifting arms (6) will address for each transfer step, while omitting those steps for which transfer is not yet required.

5 Claims, 1 Drawing Sheet

SELECTIVE MASS TRANSFER HOIST

FIELD OF THE INVENTION

The invention relates generally to wet chemistry processing systems and methods and, more particularly, to batch processing systems and methods that are utilized in conjunction with semiconductor wafers.

BACKGROUND ART

Mechanized transfer systems used in industrial multistage wet chemistry processes generally fall into one of two categories: (1) in-line processing, and (2) batch processing. Since the present invention relates primarily to batch processing, various prior-art batch processing systems and methods will now be considered. The systems used in batch processing are divided into two sub-categories: (i) mass transfer mechanisms, and (ii) free ranging hoist mechanisms. By way of introduction, the principles involved in each of the two aforementioned categories will now be described, and the disadvantages of each category will be set forth in greater detail.

Although the principles of the present invention may be applied to many industries and many mechanized transfer processes within these industries, an ophthalmic lens multi-stage critical cleaning system preceding a vacuum will be discussed for purposes of illustration.

A. Mass Transfer Technique:

Using a single hoist or walking beam, batches of substrates (in this example, lenses), racked in carrier baskets, are simultaneously transferred from one position (for example, fluid tank) to another position from an initial load position through washing, rinsing, and drying stages. Finally, batches of the substrates are transferred to an unload position, where the carriers of clean and dry lenses are then transferred by hand or conveyor, to the next desired processing location. The next location could implement, for example, a vacuum coating or dip coating process.

Since all workloads in the line-up of process tanks are transferred simultaneously in the mass transfer method, transfer is fast and a maximum number of workloads (carriers of lenses) are processed in a given time period. However, this technique also presents a number of disadvantages. The time that workloads must remain in each process position is the same for all positions. The workloads cannot be processed for different times in each position. This can be a serious handicap for many process requirements, since different times are frequently required at different stages of the process. Instead, the processes themselves—ultrasonic power, chemistry, temperature, etc., have to be adjusted until all positions require the same processing time. Another disadvantage is that the center-to-center distance between consecutive processing stages must be uniform. Yet another disadvantage is that the processing sequence must be truly sequential—in other words, this technique has no ability to skip any processing stage.

B. Free Ranging Transfer Hoist Technique:

A free ranging transfer hoist is an electronically programmed transfer hoist with the capability of moving freely in both horizontal and vertical axes. The hoist transfers workloads from tank to tank, one workload at a time, and at differing time intervals, as required for each processing stage. This technique is advantageous in that it offers a flexibility of motion approximating that of a human operator. The free-ranging hoist is able to transfer workloads forward or backward to any desired processing stage, and to comply with whatever process time and transfer requirements each particular stage demands. Moreover, the physical spacing between the centerlines of sequential stages need not be identical. The free-ranging hoist is able to address spacing variations as dictated by differences in design of the various processing stages.

The free ranging transfer hoist technique presents a number of shortcomings. Transfer of workloads, one at a time, is very time-consuming. For process sequences involving a number of stages, a single transfer hoist is not able to keep up with the number of transfers required for a given processing cycle. When, due to a large number of processing positions, or limitations in travel speed, or short processing time requirements, or a combination of these factors, the travel time becomes equal to or larger than the process time, then the transfer system itself becomes the throughput-limiting factor (the bottleneck) in the system. The use of multiple robots, with an attendant increase in system cost, then becomes necessary.

For simple wet chemistry processing systems having few stages and not more than one kind of recipe or processing sequence, such as simple cleaning systems or low throughput systems, one of the two prior art work transfer systems described in the foregoing paragraphs may be quite adequate. However, for more complex processing requirements, or for applications requiring higher throughput capability, the compromises involved in prior art methods creates significant difficulties.

OBJECTS AND SUMMARY OF THE INVENTION

A primary object of the present invention is to provide a mass transfer system that offers the simultaneous transfer and time-saving efficiencies of prior art mass transfer techniques, while also offering some or all of the flexibility of prior-art free ranging hoist techniques. This object is achieved by equipping a mass transfer mechanism and an associated software control mechanism with the ability to retract a plurality of lifting arms (6), in a manner so as to select which of the processing stages (2) the lifting arms (6) will address for each transfer step, while omitting those steps for which transfer is not yet required. Thus, for example, a carrier basket (1) (also commonly referred to as a "workload") may be moved from a spray-rinsing tank after only thirty seconds, to make room for another workload, while carrier baskets (1) in some other positions may not be transferred for several more minutes. The end result of this novel technique is that the overall throughput efficiency of the prior art mass transfer method is preserved, while the capabilities of the free ranging hoist to address various and multiple processing steps or recipes is accommodated.

DETAILED DESCRIPTION OF THE PREFERRED EMBODIMENTS

Figure 1:
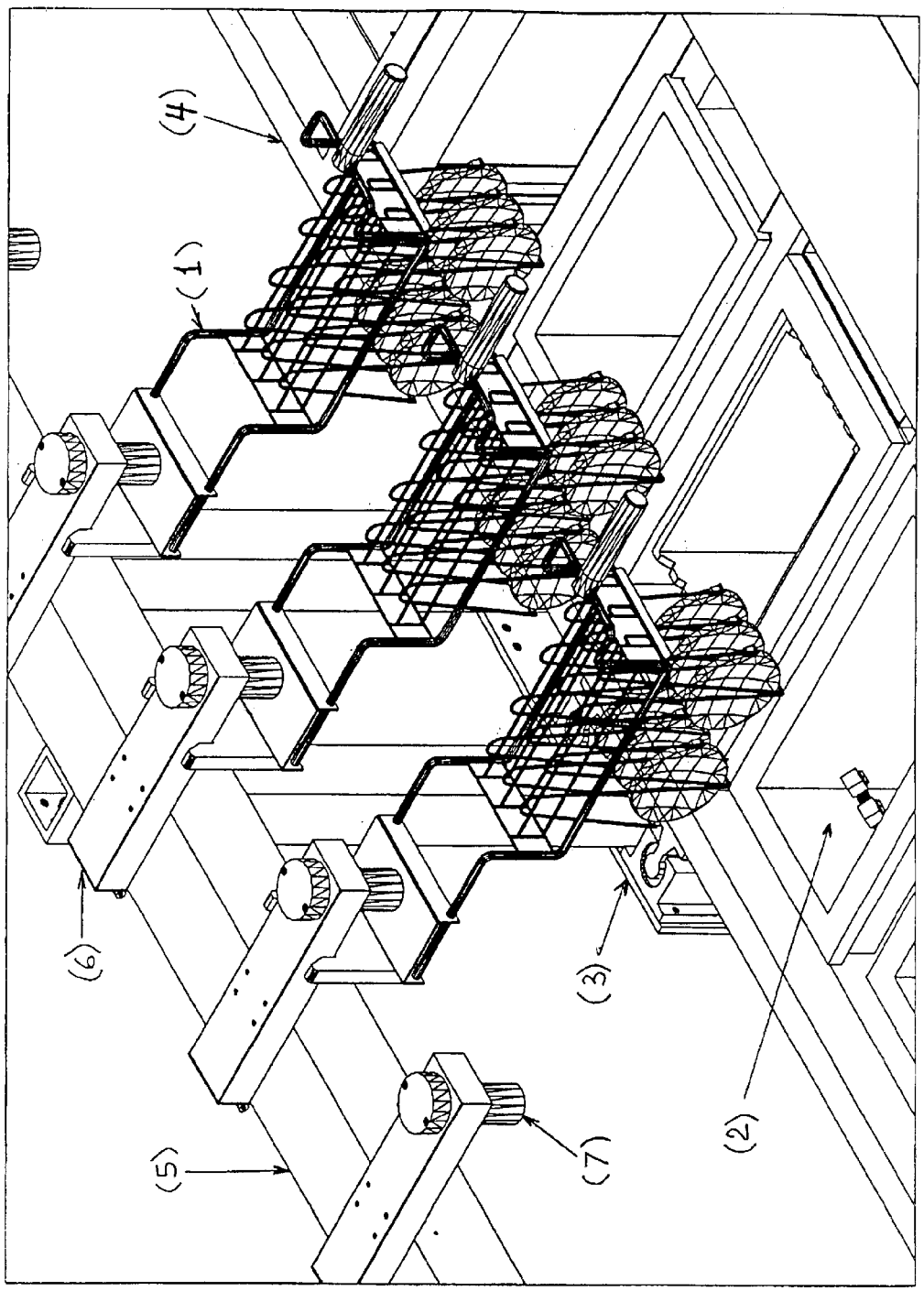
FIG. 1 is a perspective view of a selective mass transfer hoist constructed in accordance with the principles of the present invention.

Refer to FIG. 1 which is a perspective view of a selective mass transfer hoist constructed in accordance with the principles of the present invention. The selective mass transfer systems and methods of the present invention constitutes a novel approach that integrates the prior art mass transfer and free ranging hoist techniques discussed above, into a hybrid design that preserves the advantages of both and provides some additional benefits as well. The automatic work transfer system of FIG. 1 is equipped to convey a basket 1 carrying work through a row of processing stations 1 at a workstation. At each processing stage 2, a transfer hoist 3 lowers the basket 1 into a tank for processing for a predetermined dwell period, at the conclusion of which the hoist withdraws the basket 1 from the tank and transfers the basket 1 to the next stage, to continue a multi-step process. The automatic work transfer system includes a supporting rail 4 laterally displaced from the row of stages and substantially parallel thereto. Riding on the supporting rail 4 is a transfer hoist 3 provided with one or more substantially vertical shafts supported on an elevator. Attached to the substantially vertical shafts is a substantially horizontal beam 5. On the horizontal beam 5 are affixed a plurality of independently retractable arms 6. The number of retractable arms 6 is typically one less than the sum of each processing stage 2 plus the initial load position and the final unload position.

As the transfer hoist 3 advances along the supporting rail 4, a hand on or associated with the transfer hoist 3, illustratively implemented using an end effector 7, moves with the hoist substantially along a horizontal X-axis to a position in general alignment with a selected processing stage 2. When the elevator is operated, the end effector 7 is either raised or lowered with respect to the selected stage, substantially along a Y (vertical) axis that is substantially normal to the horizontal X axis. Separately controllable X and Y motors or actuators (not shown) are used to control the transfer hoist 3 and end effector 7 using electronically programmable software instructions appropriate to the processing steps to be carried out, along with a processing mechanism such as a microprocessor or personal computer.

Pursuant to one embodiment of the invention, the substantially horizontal beam 5 is fashioned in a manner similar to that of a prior art mass transfer system. A number (N-1) of arms 6 are provided, where N is a positive integer greater than two, and (N-1) equals the number of elements or workloads that are to be transferred in one pass. Every arm 6 is independently controlled, allowing any combination of workloads to be transferred, and leaving the remainder to be further processed in accordance with the requirements of the software instructions (sometimes referred to as the 'program recipe'). The design of the transfer hoist 3 and horizontal beam 5 permits moving workloads laterally by more than one processing stage 2, thereby permitting one or more processing positions to be skipped. The horizontal beam can optionally be equipped to move loads in both directions, to the left or to the right, with reference to FIG. 1. Motion along both vertical (Y) and horizontal (X) axes of the transfer hoist 3 can be encoded and analogically controlled. Workloads may be transferred at different speeds, and inserted and/or extracted in selected baths at different rates. The foregoing features provide a workload transport system that is suitable for the sophisticated processing requirements of complex wet benches. These sophisticated processing requirements may include, for example, variable sequences and/or multiple program recipes.

Pursuant to a further embodiment of the invention, the (N-1) arms 6 are installed at substantially equal intervals along the substantially horizontal beam 5. A computer and/or programmable controller (PLC) system determines which of the arms 6 has to be open, as well as which of the arms 6 has to be closed. Each arm 6 is independently controlled by a pneumatic or electrical or electromagnetic actuator. The distance between arms is substantially equal to the distance between tank center lines. The arms 6 can be placed in either an active mode or a passive mode. In the active mode, the arm 6 picks up its corresponding workload. One or more sensors read the extension for each arm 6 and confirm proper functioning of the arm 6 hardware. An up/horizontal/down move transports the workloads to a new location.

In operation, the computer or PLC system determines which workloads are to be moved at each transfer step. An electrical system controls an arm 6 corresponding to the workload to be moved, either directly or by controlling a pilot valve for a pneumatic cylinder or other actuator. The selection of an appropriate actuator device is a matter within the knowledge of the skilled artisan. When a selected corresponding arm or arms 6 have been actuated and placed in their workload pick-up position(s), one or more sensors confirm proper operation.

The horizontal beam 5 moves up vertically until the selected workloads clear the work surface 9. The horizontal beam 5 then moves horizontally by one or more positions. The horizontal beam may be moved to the left, or to the right, according to the programmed destination for the workload(s). Process vessel covers, where provided, open and close (as necessary) to permit ingress and egress of the workloads. One or more sensors may be used to confirm proper ingress and egress. The horizontal beam 5 then moves downward, placing the workloads into new positions. The arms 6 then enter their passive state, depositing the workload(s). The transport system is now ready for the next sequence of operations.

Pursuant to a further embodiment of the invention, the arms 6 are independently extended or retracted by actuators (not shown). These actuators are controlled by software in accordance with the requirements of the processing sequence being undertaken.

Pursuant to another embodiment of the invention, all the arms 6 of the transfer hoist 3 are fixed rigidly to the horizontal beam 5. To select workloads as required by the software instructions, each arm 6 is furnished with an electromagnetically coupled hand. When the software instructions require that a workload be picked up, the software causes the corresponding hand's electromagnetic coupler to be energized so as to effect the pickup for the selected position or positions.

While the particular illustrative embodiments shown and described above will be useful for various applications, further modifications to the embodiments disclosed herein will occur to persons with ordinary skill in the art. All such modifications are deemed to be within the spirit and scope of the invention defined by the appended claims.

I claim:

1. In a workstation having a row of processing stages (2) therein, each processing stage incorporating at least one of: (i) a tank of processing fluid, (ii) a load platform designed to receive a basket (1) carrying a workload, and (iii) and an unload platform designed to receive a basket (1) carrying a workload; the workstation further comprising an automated work transfer system to simultaneously convey a number of said baskets to said row of processing stages; the workstation characterized by a mass transfer hoist system comprising:

(a) a supporting rail (4) laterally displaced from said row of processing stages (2) and parallel thereto;
   (b) a transfer hoist (3) riding on said supporting rail (4), having one or more substantially vertical shafts which support a beam, also substantially parallel to the row of processing stages, the beam having a length sufficient to accommodate all processing stages within the row of processing stations (2), wherein the beam is provided with a plurality of arms (6) each equipped with an actuated end-effector (7) cantilevered into a potentially corrosive work area, and wherein the plurality of arms (6) is sufficient in number to address the number of processing stages in the row of processing stations (2) as well as the load platform and the unload platform;

(c) a plurality of baskets (1) supported by the arms (6) and actuated end-effectors (7) of the transfer hoist (3) and extending into the work area wherein the transfer hoist (3) further includes a first drive mechanism to advance the transfer hoist (3) along the rail to a position aligning respective actuated end-effectors (7) with corresponding processing stages, and a second drive mechanism to at least one of lower and raise the one or more substantially vertical shafts, to at least one of lower and raise the basket (1) held by a respective end-effector, into or out of the tank of a corresponding processing stage;

further comprising a guide rail parallel to the supporting rail (4);

further including a computing mechanism operatively coupled to said first and second drive mechanisms and programmed to cause said mass transfer hoist system to convey said baskets (1) to said stages in a programmed sequence, the baskets (1) at each of a plurality of processing stages (2) being lowered into said tank, and after a programmed dwell time, being raised out of the tank.

2. The mass transfer hoist system of claim 1, wherein said second drive mechanism includes an elevator for supporting the one or more substantially vertical shafts, and an elevator motor to at least one of raise and lower the elevator.

3. The mass transfer hoist system of claim 2 wherein each actuated end-effector (7) corresponds to a respective processing stage, and the actuated end-effectors (7) are controlled so as to cause an engagement of workloads in accordance with a predetermined processing program, and wherein at least one of: (i) one or more arms (6); and (ii) one or more end-effectors are adapted to retract after each workload transfer as specified by said programming sequence.

4. The mass transfer hoist system of claim 3 wherein the computing mechanism is operatively coupled to the actuated end-effectors (7) so as to provide independent control of each actuated end-effector with respect to other actuated end-effectors, in accordance with a programmed sequence, thereby placing some end-effectors into a passive mode, and other end-effectors into an active mode.

5. The mass transfer hoist system of claim 2 wherein the computing mechanism is equipped to determine a substantially optimized transfer sequence in real time based upon workloads requiring varied and differing process times prior to arriving at a specified workload position.

* * * * *